United States Patent [19]

Stroud et al.

[11] Patent Number: 4,947,431
[45] Date of Patent: Aug. 7, 1990

[54] HELD MUSIC HISTORY CIRCUIT

[75] Inventors: Richard S. Stroud; Fred J. Anderson, both of Kokomo; Matthew C. Reprogle, Noblesville, all of Ind.; Douglas E. White, Urbana, Ohio; Jeffrey J. Marrah; Gregory J. Manlove, both of Kokomo, Ind.

[73] Assignee: Delco Electronics Corporation, Kokomo, Ind.

[21] Appl. No.: 406,900

[22] Filed: Sep. 13, 1989

[51] Int. Cl.$^5$ ............................................. H04H 5/00
[52] U.S. Cl. ........................................ 381/13; 381/10
[58] Field of Search ............................ 381/10, 11, 13; 358/144

[56] References Cited

U.S. PATENT DOCUMENTS 3,823,268  7/1974  Modafferi .............................. 381/13

Primary Examiner—Jin F. Ng
Assistant Examiner—M. Nelson McGeary, III
Attorney, Agent, or Firm—Albert F. Duke

[57] ABSTRACT

A circuit is provided which gauges the amount of significant high-frequency spectral energy in the very recent history of the program material and ignores the effects of short noise bursts and other transients associated with FM reception in the moving vehicle. The circuit provides an output voltage which can be used to adjust the attack characteristics of an audio processor.

5 Claims, 3 Drawing Sheets

HELD MUSIC HISTORY CIRCUIT

FIELD OF THE INVENTION

This invention relates to FM adaptive audio processing and more particularly to an improved circuit for adjusting the attack characteristics of the audio processing.

BACKGROUND OF THE INVENTION

In order to combat the problems of multipath fading, distortion, and momentary loss of signal, automative FM receivers have typically been designed with some sort of audio processing in the form of blend, high-frequency rolloff, or audio attenuation. Typically, these audio processing functions are applied through the sensing of signal level (AGC) or high-frequency disturbances (ultra-sonic noise). An audio processor administers appropriate processing functions to L+R and L−R stereo decoder outputs and recombines the signal to produce Left and Right audio output.

Blend may be defined as the reduction of stereo separation produced by reducing the L−R signal. Blend is useful because in the process of decoding the composite audio signal from the FM detector, a much larger noise bandwidth is opened along with the decoded L−R signal. This inherent noise theoretically contributes 26 dB more noise when the receiver is in full stereo than when it is in the mono mode. Blend, therefore, can be called upon to attenuate this random, broadband noise during weak signal conditions.

In addition to the reduction of the broadband "stereo" noise, blend also reduces the noise and distortion created by multipath interference and co-channel and adjacent-channel interference. In these conditions, distortion and intermodulation (IM) products show up in great quantities in the L−R subbands. Consequently, when the Left and Right signals are decoded, these objectionable products are included in the program material, being perceived by the listener as noise.

The application of blend will, of course, result in the loss of stereo separation. In order to effectively reduce noise, this separation loss must be nearly total i.e. a substantial reduction of noise carries with it the entire loss of stereo separation. During reception of high stereo content signals such as instrumental music, a sudden loss of separation will be perceived as a collapse of the stereo image. A slighter, second-order effect is the apparent loss of some of the treble content of the music. Some of this loss is real i.e. elimination of the treble-rich L−R subband, but a large portion of the apparent loss is imagined. The imaginary component of the loss is due to reduction of noise. If the audio signal has little high-frequency information of its own, the reduction of noise sounds like a loss of treble. This is part of what is known as the "masking" phenomenon.

High-frequency rolloff deliberately limits the bandwidth of the audio signal to attenuate noise in the high-frequency portion of the audible spectrum. The implementation of this usually involves the dynamic control of a low-pass filter whose attenuation range is gradually moved into the high-frequency spectrum. Typically, maximum rolloff consists of a first-order attenuation curve (6 dB/octave) at a break frequency of 1.5-2 kHz. The rolloff function is applied to both L+R and L−R paths.

In order to further explain the nature of the audio processing functions, particularly rolloff, reference is made to FIGS. 1a and 1b. "Noise masking" refers to the ability of program material, with a given spectral density, to effectively "cover over" the presence of broadband (random) noise from the listener's viewpoint. This effect is strongly influenced by the ear's sensitivity to noise in different frequency ranges, as well as the triangular noise vs. frequency characteristic of an FM detector. FIGS. 1a and 1b illustrate noise masking for treble-rich music and a single tone respectively. Treble-rich music, has a very broad spectral density which tends to "mask" the presence of the noise. A single tone, on the other hand, tends to mask broadband noise only in the vicinity of the tone's characteristic frequency.

The extent to which rolloff may improve perceived S/N depends mainly upon the degree of "masking" of noise by the program material. The unavoidable consequence of rolloff is, of course, that any program content in the frequency range of rolloff action is attenuated along with the undesired noise. If the music masks the noise effectively, then application of rolloff does little or nothing to enhance the perceived S/N. It only serves to attenuate the program material high-frequency content in the ears of the listener. On the other hand, rolloff is very effective if little program material energy resides in the noise region i.e. both measured and perceived S/N improve dramatically.

SUMMARY OF THE INVENTION

As discussed above, there are S/N advantages to be gained by applying blend and rolloff; on the other hand, there are serious fidelity tradeoffs. One therefore would not want to apply noise countermeasures when the program spectral content effectively masks the noise. In current audio processing circuits, no means are provided to accurately gauge this masking effect and apply this information to the intelligent control of an audio processing system. Blend and rolloff are conventionally applied whenever a disturbance is indicated by changing AGC or USN voltages, regardless of the current music spectral content. The result is unnecessary loss of fidelity and excessive "pumping" of audio processing measures. Moreover, a circuit which merely gauged the total high-frequency content of the recovered audio, would suffer from its inability to distinguish between regular program material and a sudden noise burst i.e. the noise burst would "fool" the circuit into responding as if there were adequate high-frequency masking information. This would be exactly the opposite effect desired i.e. the audio processor would not properly respond to a severe noise burst.

In accordance with the present invention a held music history circuit is provided which gauges the amount of significant high-frequency spectral energy in the very recent history of the program material and ignores the effects of short noise bursts and other transients associated with FM reception in the moving vehicle. The output of the circuit is a voltage which is used to adjust the attack characteristics of the audio processor.

BRIEF DESCRIPTION OF THE DRAWINGS

The above and other advantages of the invention will become more apparent from the following description taken in conjunction with the accompanying drawings wherein like references refer to like parts and wherein.

DETAILED DESCRIPTION

Figures 1A, 1B:
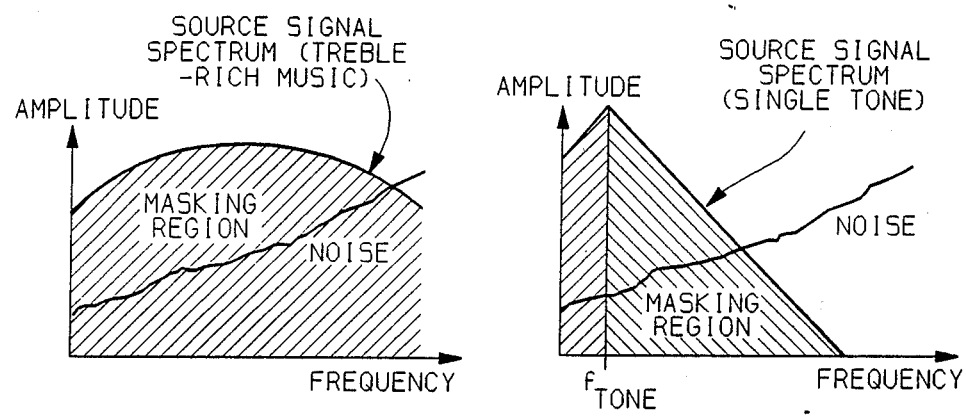
FIGS. 1a and 1b illustrate the phenomenon of noise masking.
Figure 2:
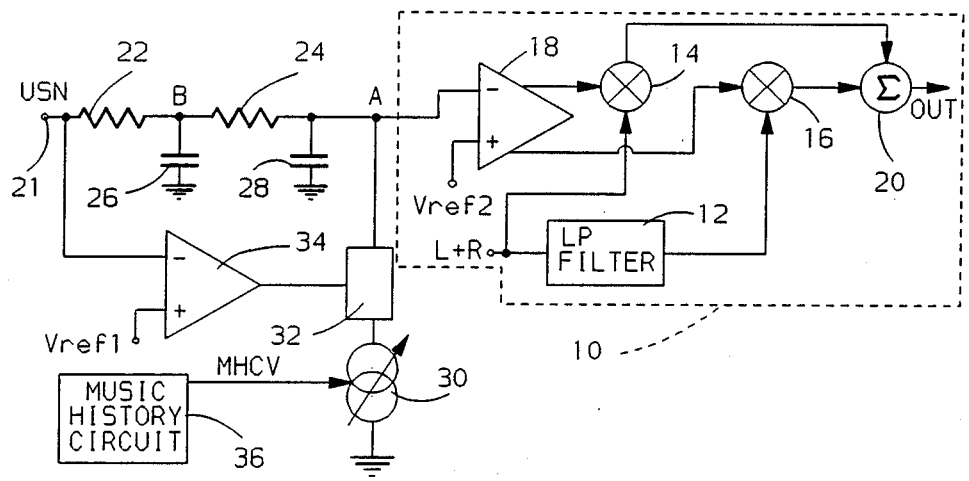
FIG. 2 is a block diagram of the rolloff circuitry and music history control of the present invention.

Referring now to FIG. 2, rolloff circuitry for the L+R signal is generally designated 10 and responds to a control voltage at Node A. The voltage at node A controls the bandwidth of the L+R signals. The L+R signal is applied to a lowpass filter 12. The direct and lowpass filtered L+R signals are applied to multipliers 14 and 16 respectively, which are controlled from differential amplifier 18 in proportion to the voltage level of node A. The outputs of the multipliers is combined in summer 20.

If node A is a maximum, for example 4 V dc, the direct signal will be multiplied by 1 in the multiplier 14, and the lowpassed signal will be multiplied by 0 in the multiplier 16, resulting in only a direct signal at the output of the summer 20. If node A is a minimum, the direct signal will be multiplied by 0 and the lowpassed signal will be multiplied by 1, resulting in only a rolled-off signal at the output of the summer 20. Similarly, when the amplifier 18 is only partially tilted due to a voltage at node A which is between the maximum and minimum, a partially rolled-off signal will result due to the proportional mixing of direct and lowpassed signals. The outputs of the the amplifier 18 are also applied to rolloff circuitry (not shown) identical to the filter 12, multipliers 14,16, and summer 20 but which respond to the L−R signal.

There are two control inputs to the circuit of FIG. 2. The first is an Ultra Sonic Noise (USN) applied at terminal 21. The USN voltage input is a DC voltage proportional to the noise present between 100 kHz and 200 kHz and is therefore a good indicator of signal conditions. The DC level is 4 V when no noise is present, and may drop as low as 2 V under extremely poor signal conditions. The USN voltage is applied to a dual time constant RC circuitry comprising resistors 22,24 and capacitors 26,28 which lowpasses the USN input at node A. The time constant of the RC network 22,26 is relatively long in comparison with the time constant of the RC network 24,28. For example, the value of the resistors 22 and 24 may be 100K and 47K respectively while the capacitors 26 and 28 may be 4.7 uf and 0.01 uf respectively. A variable current source 30 is connected with the Node A though a CMOS transmission gate or switch 32 which is controlled by comparator 34. If USN drops below a predetermined reference voltage Vref1 of, for example 3.6 V, the output of comparator 34 goes high and closes the switch 32 to connect the current source 30 to Node A.

The current source 30 responds to the second control input to the circuit in FIG. 2, namely the output of a music history circuit generally designated 36. The amount of current provided by the source 30 is directly proportional to the output voltage designated MHCV. The rate at which the current source 30 discharges the capacitors 28 and 26 is thus dependent on MHCV. The greater the current from the source 30, the faster the voltages at both Nodes A and B are pulled down. For a given current (MHCV voltage) node A will drop more quickly relative to Node B because of the resistor 24 in the discharge path of capacitor 26. When USN rises above the reference input Vref1, the source 30 is disconnected from node A and the voltages at Nodes A and B begin to rise. If the noise duration is short, i.e. the switch 32 is only closed for a short time, Node A will quickly recover to the voltage that existed prior to the noise. On the other hand, is the noise duration is long enough to reduce the voltage at Node B, Node A will take longer to return to the previous level due to the long time constant of the network 22,26 and consequently, the signal will be rolled off for a longer period of time. There is thus a quick recovery of full bandwidth when a noise duration is short but a longer noise duration will eventually pull the voltage down at point B. Because of the long time constant of 22,26, the voltage on node B and consequently node A will take some time to return to 4 V when the noise burst disappears. This causes the circuit to remain rolled-off for a relatively long duration of time. By controlling the amount of current available from the source 30, the attack time of the rolloff process can be varied to take into consideration the treble content in the program material and where high treble content is present, short noise bursts and other transient conditions can be ignored.

Figure 3:
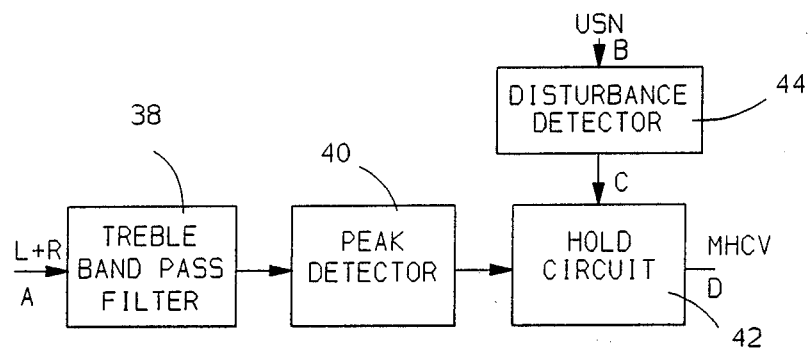
FIG. 3 is a block diagram of the music history control circuitry of the present invention.

Referring now to FIG. 3 a more detailed block diagram of the Music History circuit 36 is shown. A band pass filter 38 passes the treble frequencies of the L+R signal to provide a representative sample of the treble content. The output of the filter 38 is fed to a peak detector 40 which produces a DC voltage proportional to the amount of treble content in the incoming L+R signal. The filter 38 provides a second-order bandpass function with a center frequency of 7 kHz and a −6 dB bandwidth of 4 kHz in order to adequately isolate the desired masking information. At center frequency, the gain should be high enough to insure adequate signal strength to overcome peak detector offsets, but low enough to prevent saturation; 22 dB has been chosen based on typical music spectral content. The output of the peak detector 40 is provided to a hold circuit 42. The hold circuit 42 is controlled by a disturbance detector 44 which provides an indication of poor signal conditions. The MHCV output of the hold circuit 42 is applied to the variable current source 30 (FIG. 2) which controls the attack time of the rolloff control voltage at Node A. The hold circuit 42 maintains the MHCV voltage during poor signal conditions to avoid variation in the voltage MHCV as a result of noise. The voltage MHCV is thus a true indicator of the treble content in the program, hence the reference to "music history".

Figure 4:
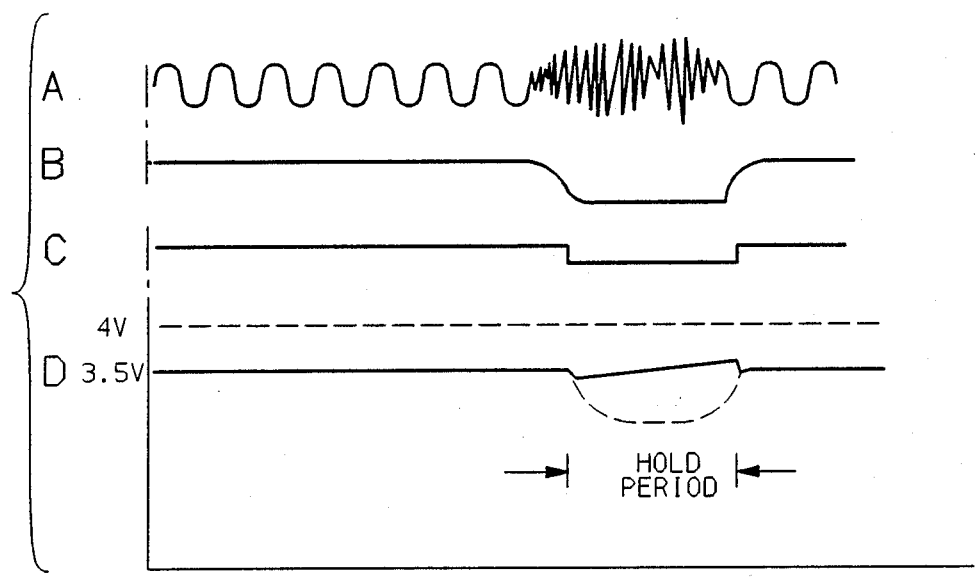
FIG. 4 shows waveforms associated with the block diagram of FIG. 3.

FIG. 4 shows typical waveforms at various nodes of the music history circuit. Waveform A depicts the input signal L+R subject to a noise burst. Waveform B is the USN control voltage. It is nominally at 4 V with a deviation in the negative direction when the noise burst occurs. Waveform C is the output of the disturbance detector 44. It is a digital signal whose output is high until the noise burst occurs. When waveform C goes low, the output of the peak detector is held at substantially its present value as shown in Waveform D. The control voltage MHCV shown in Waveform D tracks the output of the peak detector 40 except when the output of the disturbance detector 44 goes low. During this period of time, the peak detector's value, prior to the disturbance, is held. The dotted line in Waveform D depicts the effect on the output of the peak detector 40 in the presence of the noise burst. This drop in MHCV is prevented by isolating the hold circuit 42 from the peak detector 40 during the noise pulse. The slight rise in the MHCV control voltage during the isolation is due to capacitor charging during the noise burst.

Figure 5:
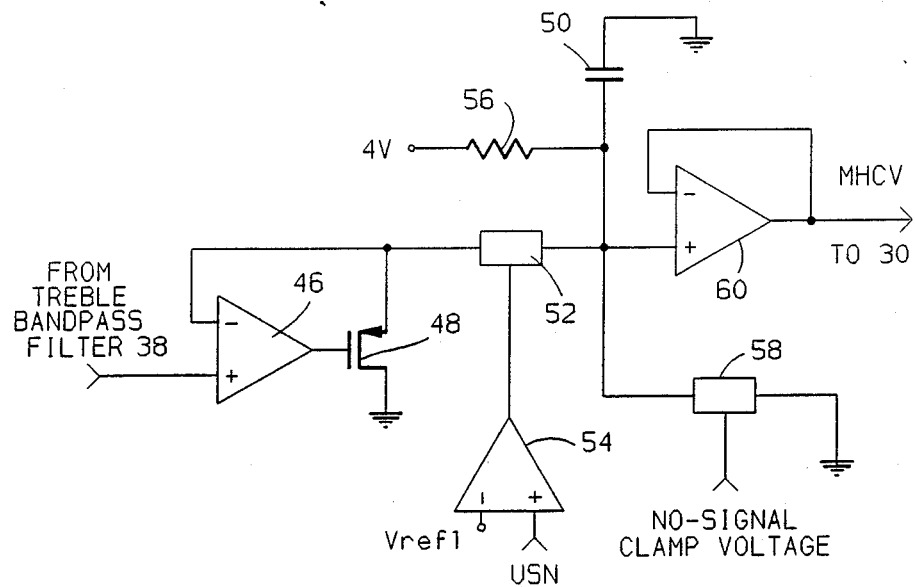
FIG. 5 is a more detailed schematic of the peak detector and hold circuit of the present invention.

Referring now to FIG. 5, the peak detector 40 includes an operational amplifier 46 having a positive input connected with the output of the filter 38. The output of the amplifier 46 is connected to the gate of a P-type MOS transistor 48 having its drain connected to ground. The source of transistor 48 is connected to a 1 uf capacitor 50 through a CMOS transmission gate or switch 52. The capacitor 50 is also connected to a 4 V supply though a 1M ohm resistor 56 and charges toward supply whenever the transistor 48 is turned off or the gate 52 is open. The charge on the capacitor 50 follows the negative peaks of the input signal to the amplifier 46 as long as the switch 52 is closed. As the input begins to move in a positive direction, the transistor 48 is turned off and the capacitor 50 begins to charge toward the 4 V supply but with a time constant of about 1 second. The voltage on the capacitor 50 is thus indicative of the amplitude of the treble content in the audio signal. The voltage on the capacitor 50 is buffered by the operational amplifier 60 to provide the MHCV output. The gate 52 is controlled by the disturbance detector 44 which comprises a comparator 54. The comparator 54 monitors USN and its output switches low to open the switch 52 when the USN voltage goes below Vref1. This threshold is selected to correspond to the magnitude of a disturbance which would begin to corrupt the audio signal. A negative swing on the USN input (corresponding to a disturbance) causes the gate 52 to open, preventing the charge on the hold capacitor 50 from being affected by noise at the input of the amplifier 46. The charge on the capacitor 50 follows the input to the amplifier 46 as it moves in a negative direction. When the voltage on the positive input of the amplifier 46 reverses direction, the amplifier 46 presents a positive gate to source voltage to the transistor 48, turning it off and isolating the hold capacitor 50 from the output of the amplifier 46. The capacitor 50 can then charge through the resistor 56 toward 4 V, providing a finite hold period. Typically, the noise bursts are on the order of 10–500 mS, so the charge time constant is best adjusted to approximately one second. A much longer noise burst is indicative of particularly poor signal conditions and will eventually cause the capacitor 50 to charge to 4 V, increasing the current in the source 30 to a maximum. This insures that a minimum bandwidth signal for a reasonably long duration. The voltage on the capacitor 50 has the following sense. A maximum voltage of 4 V produces maximum audio processing attack speed by increasing the discharge current in source 30. As the voltage on the capacitor 50 is reduced below 4 V, attack speed is accordingly reduced by reducing the discharge current in source 30. The faster the attack the sooner the high frequency content of the audio is rolled off.

A no-signal clamp voltage controls a CMOS transmission gate 58 which grounds the capacitor 50 to make sure that when the receiver loses signal or is tuned between stations, audio processing occurs at maximum attack rate. This will insure immediate rolloff action as the receiver is tuned away from a strong signal to a vacant or very weak channel. The no-signal clamp voltage is generated, typically, by a between-channel noise detection circuit such as is found in an audio attenuator (mute) system.

Figure 6:
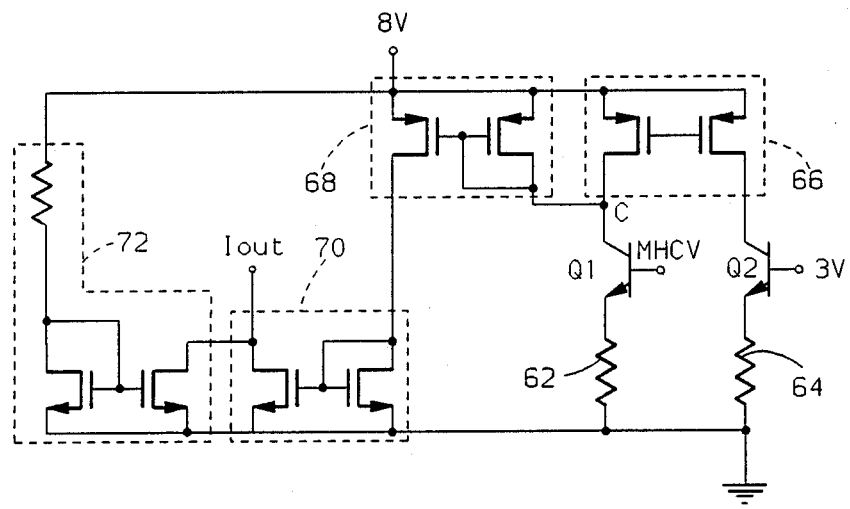
FIG. 6 is a schematic of the voltage to current converter of FIG. 2.

The variable current source 30 is a voltage-to-current translator and is shown in greater detail in FIG. 6. The circuit of FIG. 6 converts MHCV to a current which produces the desired processing attack rate indicated. The circuit will deliver 10–110 uA currents to Node A where 10 uA represents an arbitrary minimum attack rate, and 110 uA represents a maximum attack rate. The slower the attack time, the less likely isolated noise bursts, which are effectively masked during periods of high treble content, will produce a rolloff of the audio. The source 30 comprises transistors Q1 and Q2 connected with 10K emitter resistors 62 and 64. The current out of transistor Q2 is reflected through a current mirror generally designated to 66 to node C where it is subtracted from the current in transistor Q1. This difference current is applied to a current mirror generally designated 68 whose output is applied to a current mirror generally designated 70. The output of current mirror 70 is designated Iout and is supplied to Node A when the switch 32 is closed. A minimum Iout current of 10 uA is provided by current source 72 when MHCV drops below 3 V. If the music history control voltage MHCV is 4 V, the current through transistor Q1 is 100 uA greater than the current through transistor Q2. This current is reflected to Iout through current mirrors 68 and 70 and combined with the current from source 72 to provide 110 uA output current. As the MHCV drops, the current through transistor Q1 drops, which in turn reduces the current reflected to Iout. Finally, when the MHCV goes below 3 V, no current is reflected from current mirror 68 and the current Iout is reduced to the minimum of 10 uA.

The embodiments of the invention in which an exclusive property or privilege is claimed are defined as follows:

1. An audio processing circuit for an FM stereo receiver comprising rolloff circuit means for reducing the bandwidth of an audio signal as a function of an input control voltage which is proportional to the amount of ultra sonic noise in the FM stereo signal, means for varying the attack time of said rolloff circuit as a function of the treble content in said audio signal, whereby the bandwidth of the audio signal is reduced in the presence of noise unless the audio signal contains sufficient treble content to mask the noise.

2. An audio processing circuit for an FM receiver comprising a band pass filter for filtering program material on an L+R channel of a received stereo signal to provide a signal representation of the treble content thereof, peak detector means responsive to the output of said filter for providing a DC voltage signal proportional to said treble content, a charge storage network including a capacitor, gate means for connecting the output of said peak detector means to said capacitor in the absence of a gate opening control signal whereby the voltage on said capacitor is proportional to said treble content, disturbance detector means providing said gate opening control signal when a voltage proportional to noise exceeds a predetermined threshold to prevent the disturbance from affecting the voltage on said capacitor, voltage to current translator means for converting the voltage on said capacitor, and rolloff circuit means including time delay means responsive to the output of said translator means for varying the attack time of said rolloff circuit as a function of the treble content in said program material.

3. The invention defined in claim 2 wherein said voltage to current translator means is a variable current source.

4. The invention defined in claim 3 wherein said time delay means is dual time constant network.

5. The invention defined in claim 2 wherein said charge storage network includes a resistor and the time constant of the network is greater than a predetermined amount of time.

* * * * *